US012694932B2

(12) United States Patent
Igarashi et al.

(10) Patent No.: US 12,694,932 B2
(45) Date of Patent: Jul. 28, 2026

(54) MEMORY DEVICE CONFIGURED TO APPLY DIFFERENT VOLTAGES TO WIRINGS DEPENDING ON A CURRENT FLOWING THROUGH CORRESPONDING MEMORY STRINGS

(71) Applicant: Kioxia Corporation, Tokyo (JP)

(72) Inventors: Hideki Igarashi, Yokohama Kanagawa (JP); Takaya Izumi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 24 days.

(21) Appl. No.: 18/596,541

(22) Filed: Mar. 5, 2024

(65) Prior Publication Data

US 2024/0321362 A1     Sep. 26, 2024

(30) Foreign Application Priority Data

Mar. 20, 2023     (JP) ................................. 2023-044238

(51) Int. Cl.
*G11C 16/10*          (2006.01)
*G11C 16/04*          (2006.01)
*G11C 16/34*          (2006.01)
(52) U.S. Cl.
CPC ........ *G11C 16/102* (2013.01); *G11C 16/0433* (2013.01); *G11C 16/3404* (2013.01)

(58) Field of Classification Search
None
See application file for complete search history.

(56) References Cited

U.S. PATENT DOCUMENTS

| | | |
|---|---|---|
| 10,768,222 B1 | 9/2020 | Brozek |
| 10,978,160 B2 | 4/2021 | Wu et al. |
| 11,422,736 B2 | 8/2022 | Pachamuthu et al. |
| 2017/0255410 A1* | 9/2017 | Shiga ................. G11C 16/3459 |

* cited by examiner

*Primary Examiner* — Alfredo Bermudez Lozada
(74) *Attorney, Agent, or Firm* — Kim & Stewart LLP

(57)                    ABSTRACT

A memory device includes first and second strings including transistors, a first wiring connected to the first string, a second wiring connected to the second string, a third wiring connected to both strings, and a circuit for executing a write operation on a first transistor of the first string and a second transistor of the second string. The operation includes a first operation by which a first voltage is applied to the wirings and a second operation by which a second voltage is applied to gates of the first and second transistors. When a current flows between the first and third wirings but does not flow between the second and third wirings in the first operation, the circuit causes a third voltage to be applied to the first wiring, and causes a fourth voltage higher than the third voltage to be applied to the second wiring in the second operation.

9 Claims, 15 Drawing Sheets

| | | | | | | | | |
|---|---|---|---|---|---|---|---|---|
| INHIBIT DESIGNATION DATA | 1 | 1 | 1 | 1 | 0 | 1 | 1 | 0 |

TO "1" REGARDLESS OF WRITE DATA    ↑  ↑    TO "1" REGARDLESS OF WRITE DATA

| | | | | | | | | |
|---|---|---|---|---|---|---|---|---|
| MH OPEN READ RESULT DATA | 1 | 1 | 0 | 0 | 1 | 1 | 1 | 1 |

*FIG. 11*

MEMORY DEVICE CONFIGURED TO APPLY DIFFERENT VOLTAGES TO WIRINGS DEPENDING ON A CURRENT FLOWING THROUGH CORRESPONDING MEMORY STRINGS

CROSS-REFERENCE TO RELATED APPLICATION

This application is based upon and claims the benefit of priority from Japanese Patent Application No. 2023-044238, filed Mar. 20, 2023, the entire contents of which are incorporated herein by reference.

FIELD

Embodiments described herein relate generally to a memory device and a method performed thereby.

BACKGROUND

As a memory device, a NAND flash memory is known.

BRIEF DESCRIPTION OF THE DRAWINGS

FIG. 1 shows elements, connections of the elements, and related elements in a memory system including a memory device according to a first embodiment.

FIG. 8 shows a state and internal data of a part of the memory device according to the first embodiment.

FIG. 10 shows internal data during inhibit processing performed by the memory device according to the first embodiment.

FIG. 11 shows internal data and a voltage applied to a wiring during a program operation by the memory device according to the first embodiment.

DETAILED DESCRIPTION

Figure 2:
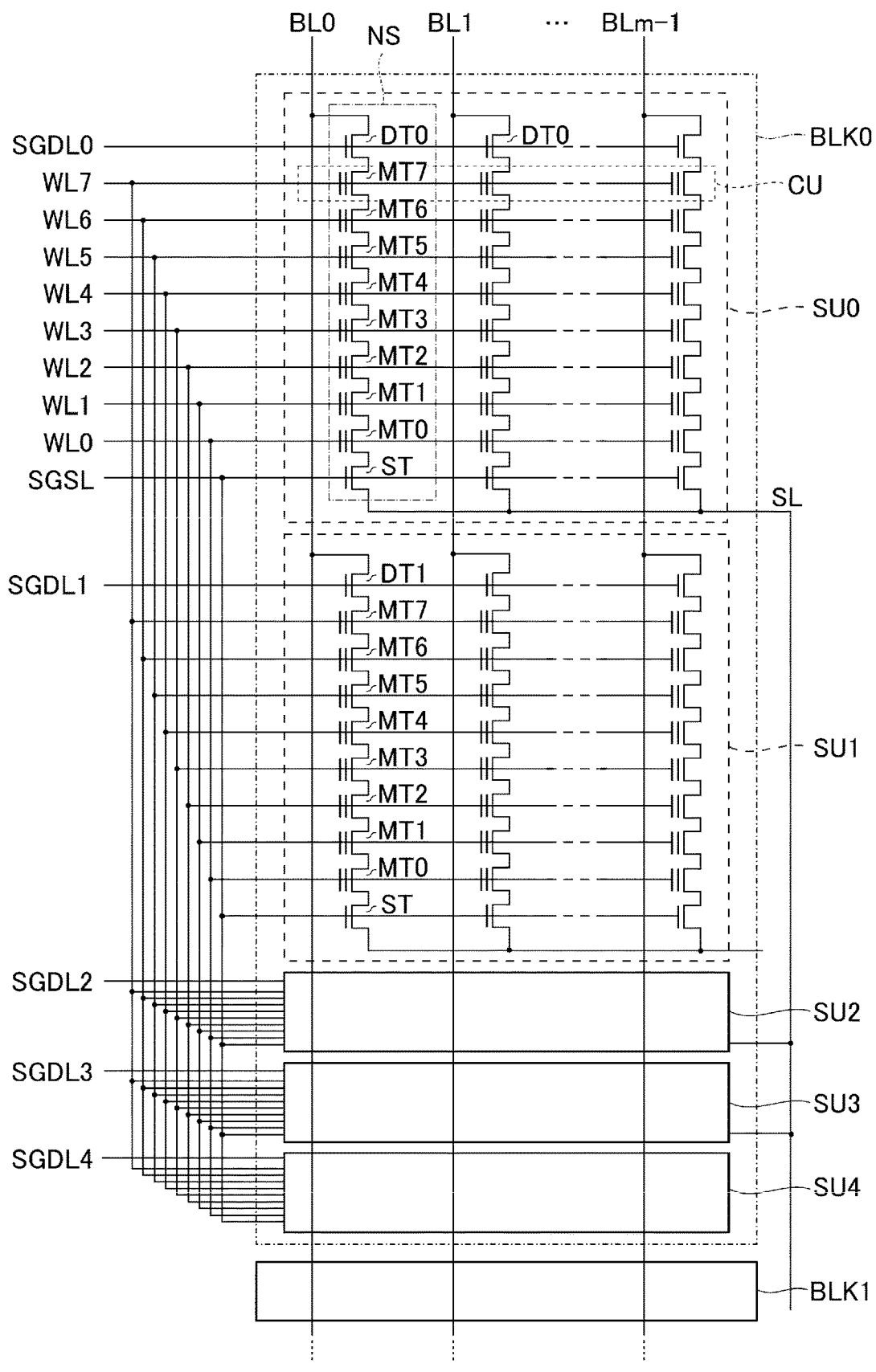
FIG. 2 shows elements of a block and connections of the elements in the memory device according to the first embodiment.

Embodiments provide preventing deterioration of a memory cell transistor.

In general, according to one embodiment, a memory device comprises a first memory string including a plurality of memory cell transistors that are connected in series, a second memory string including a plurality of memory cell transistors that are connected in series, a first wiring connected to one end of the first memory string, a second wiring connected to one end of the second memory string, a third wiring connected to the other end of the first memory string and the other end of the second memory string, and a control circuit configured to execute a write operation on a first memory cell transistor, which is one of the memory cell transistors of the first memory string, and a second memory cell transistor, which is one of the memory cell transistors of the second memory string, the write operation including: a first operation by which a first voltage is applied to the first and second wirings, and a second operation by which a second voltage is applied to gates of the first and second memory cell transistors. The control circuit is configured to: when a current flows between each of the first and second wirings and the third wiring in the first operation, cause a third voltage to be applied to the first and second wirings in the second operation, and when a current flows between the first and third wirings but does not flow between the second and third wirings in the first operation, cause the third voltage to be applied to the first wiring, and cause a fourth voltage higher than the third voltage and lower than the second voltage to be applied to the second wiring in the second operation.

Embodiments are described below with reference to the drawings. In the following description, elements having substantially the same functions and configurations are denoted by the same reference numerals. Additional numbers or letters may be designated to the ends of the reference numerals to distinguish a plurality of elements having substantially the same functions and configurations from each other.

Descriptions of certain embodiments are applicable as descriptions of other embodiments unless explicitly or obviously excluded.

In the present specification and the claims, the terms "substantially the same", "approximately the same", and "substantially uniform" are intended to be the same, but they refer to allowing errors as well as not being exactly the same due to the limitations of manufacturing and/or measurement techniques.

In the present specification and the claims, the expression that a certain first element is "connected to" another second element includes that the first element is connected to the second element via an element that is directly or constantly or selectively conductive. The expression "electrically connected" may be achieved via an insulator as long as an operation is performed in the same manner as when being electrically connected.

Hereinafter, a rectangular coordinate system including an x axis, a y axis, and a z axis is used. In the following description, the description "lower" and its derivatives and related words refer to a position of smaller coordinates on the z axis, and the description "upper" and its derivatives and related words refer to a position of larger coordinates on the z axis.

1. First Embodiment

1.1. Configuration (Structure)

Figure 1:
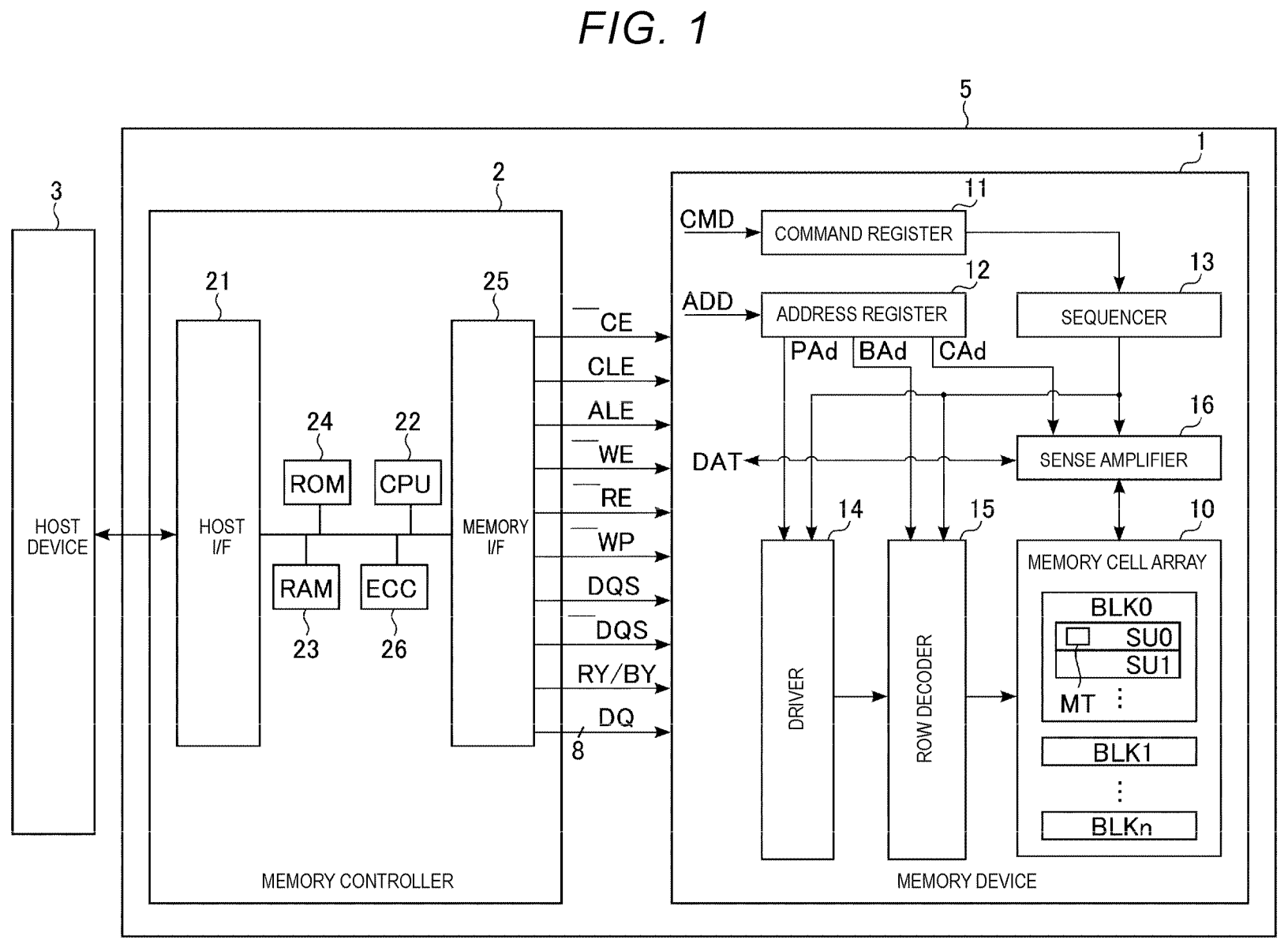

FIG. 1 shows elements, connections of the elements, and related elements in a memory system 5 including a memory device 1 according to a first embodiment. As shown in FIG. 1, the memory system 5 is controlled by a host device 3 and includes the memory device 1 and a memory controller 2. The memory system 5 may be, for example, a solid state drive (SSD) or an SDTM card.

The memory device 1 is controlled by the memory controller 2. The memory controller 2 receives a command from the host device 3 and controls the memory device 1 according to the received command.

1.1.1. Memory Controller

The memory controller 2 includes a host interface 21, a central processing unit (CPU) 22, a random access memory (RAM) 23, a read only memory (ROM) 24, a memory interface 25, and an error correction code (ECC) circuit 26. The memory controller 2 executes various operations and a part of functions of the host interface 21 and the memory interface 25 by executing the firmware (i.e., programs) stored in the ROM 24 and loaded onto the RAM 23 by the CPU 22. The RAM 23 further temporarily stores data and functions as a buffer memory and a cache memory.

The host interface 21 is connected to the host device 3 via a bus and controls communication between the memory controller 2 and the host device 3. The memory interface 25 is connected to the memory device 1 and controls communication between the memory controller 2 and the memory device 1.

The ECC circuit 26 performs processing necessary for error detection and correction on data written into the memory device 1 and data read from the memory device 1. Specifically, the ECC circuit 26 performs error correction encoding processing on the data written in the memory device 1. Data including redundant data after the error correction encoding is written into the memory device 1 as write data. In addition, the ECC circuit 26 detects an error in the data read from the memory device 1. When there is an error, the ECC circuit 26 attempts to correct the error.

1.1.2. Memory Device

The memory device 1 is connected to the memory controller 2 via a NAND bus. The NAND bus conveys a plurality of control signals and an input/output signal DQ having a width of 8 bits. The control signals include signals ‑CE, CLE, ALE, ‑WE, ‑RE, ‑WP, data strobe signal DQS and ‑DQS, and a ready/busy signal RB. The symbol "‑" indicates inversion logic. The memory device 1 receives the input/output signal DQ and transmits the input/output signal DQ. The input/output signal DQ includes a command (CMD), write data or read data (DAT), address information (ADD), and a status (STA).

The signal ‑CE is a signal for enabling the memory device 1. The signal CLE is a signal for notifying the memory device 1 that a command is transmitted by the input/output signal DQ. The signal ALE is a signal for notifying the memory device 1 that an address signal is transmitted by the input/output signal DQ. The signal ‑WE is a signal for instructing the memory device 1 to receive the input/output signal DQ. The signal ‑RE is a signal for instructing the memory device 1 to output the input/output signal DQ. The ready/busy signal RB indicates whether the memory device 1 is in a ready state or in a busy state, and indicates the busy state when it is at a low level. The memory device 1 accepts a command in the ready state, and does not accept a command in the busy state.

The memory device 1 includes elements such as a memory cell array 10, a command register 11, an address register 12, a sequencer 13, a driver 14, a row decoder 15, and a sense amplifier 16.

The memory cell array 10 includes a plurality of memory blocks BLK (BLK0, BLK1, . . . ). Each block BLK is a set including a plurality of string units SU (SU0, SU1, . . . ). Each string unit SU is a set including a plurality of NAND strings NS (not shown). Each string NS includes a plurality of memory cell transistors MT.

The command register 11 stores the command CMD received by the memory controller 2. The command CMD is used for instructing the sequencer 13 to perform various operations including a data read operation, a data write operation, and data erase operation.

The address register 12 stores the address information ADD received by the memory controller 2. The address information ADD includes, for example, a block address BAd, a page address PAd, and a column address CAd. The block address BAd, the page address PAd, and the column address CAd are used for selecting a block BLK, a word line WL, and a bit line BL, respectively.

The sequencer 13 controls the operation of the memory device 1 as a whole. The sequencer 13 controls the driver 14, the row decoder 15, and the sense amplifier 16 according to the command CMD received from the command register 11 to execute various operations including a data read operation, a data write operation, a data erase operation, and the like.

The driver 14 generates various voltages necessary for the operation of the memory device 1 and supplies a selected one of the plurality of voltages to the row decoder 15.

The row decoder 15 applies a voltage applied from the driver 14, to one block BLK selected based on the block address BAd received from the address register 12.

The sense amplifier 16 senses a state of the memory cell transistor MT, generates read data based on the sensed state, or transfers write data to the memory cell transistor MT.

1.1.3. Circuit Configuration of Memory Cell Array

FIG. 2 shows elements of one block and connections of the elements in the memory device 1 according to the first embodiment. The plurality of blocks BLK, for example, all the blocks BLK include the elements and the connections shown in FIG. 2.

One block BLK includes a plurality of string units SU. The number of the blocks BLK provided in the memory device 1 and the number of the string units SU in one block BLK may be set to a freely selected number. The following description is based on an example in which one block BLK includes five string units SU0 to SU4.

Each of m bit lines BL0 to BLm-1 is connected to one NAND string NS from each of the string units SU0 to SU4 in each block BLK, where m is a positive integer.

Each NAND string NS includes one select gate transistor ST, a plurality of memory cell transistors MT, and one select gate transistor DT (DT0, DT1, DT2, DT3, or DT4). FIG. 2 is based on an example in which each NAND string NS includes eight memory cell transistors MT0 to MT7.

The memory cell transistor MT is an element that includes a control gate electrode and a charge storage film insulated from the surroundings, and that stores data in a non-volatile manner based on an amount of charge in the charge storage film. Each of the select gate transistors ST and DT is used for selecting the string unit SU when performing various operations.

The select gate transistor ST, the memory cell transistor MT, and the select gate transistor DT are connected in series between a source line SL and one bit line BL in this order.

A plurality of the NAND strings NS which are respectively connected to a plurality of the different bit lines BL constitute one string unit SU. In each string unit SU, the control gate electrodes of the memory cell transistors MT0 to MT7 are connected to the word lines WL0 to WL7, respectively. A set including the memory cell transistors MT that share the word line WL in one string unit SU is called a cell unit CU.

The select gate transistors DT0 to DT4 belong to the string units SU_0 to SU_4, respectively. In FIG. 2, the select gate transistors DT2 to DT4 are not shown. A gate of the select gate transistor DT0 of each of the plurality of NAND strings NS of the string unit SU_0 is connected to a select gate line SGDL0. Similarly, gates of the select gate transistors DT1, DT2, DT3, and DT4 of the plurality of NAND strings NS of each of the string units SU_1, SU_2, SU_3, and SU_4 are connected to select gate lines SGDL1, SGDL2, SGDL3, and SGDL4.

A gate of the select gate transistor ST is connected to the select gate line SGSL.

The elements of the block BLK and the connections of the elements in the memory device 1 according to the first embodiment are not limited to the examples described above. For example, the number of the memory cell transistors MT and the select gate transistors ST and DT provided in each NAND string NS may be designed to be a freely selected number.

1.1.4. Configuration of Sense Amplifier

Figure 3:
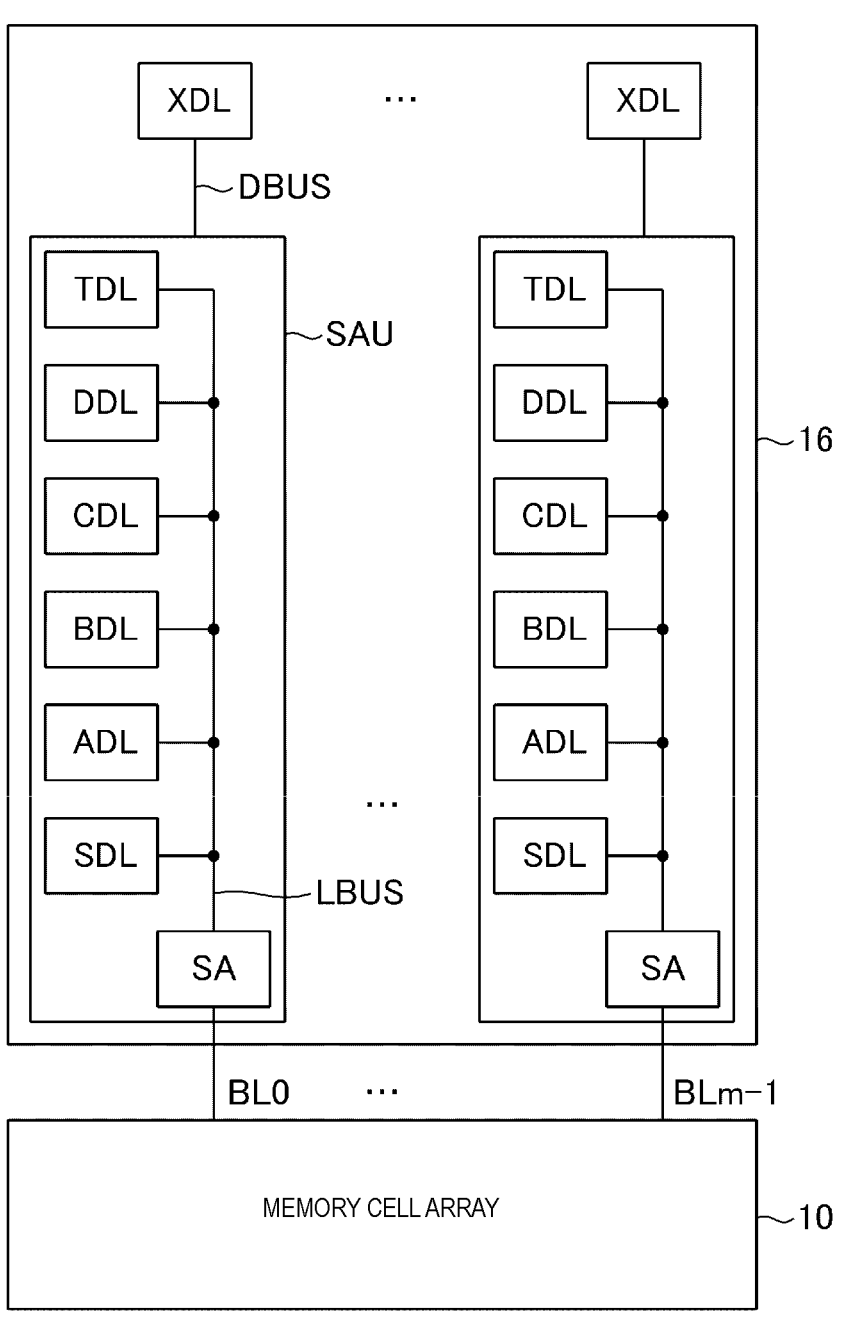
FIG. 3 shows elements and connections of the elements in a sense amplifier of the memory device according to the first embodiment.

FIG. 3 shows elements and connections of the elements in a sense amplifier of the memory device 1 according to the first embodiment.

As shown in FIG. 3, the sense amplifier 16 includes a plurality of sense amplifier units SAU and a plurality of latch circuits XDL. The sense amplifier unit SAU is provided for each bit line BL. The latch circuit XDL is provided for each sense amplifier unit SAU, for example. The latch circuit XDL temporarily stores the read data and the write data. The latch circuit XDL is used for inputting and outputting data between the sense amplifier unit SAU and an input/output circuit in the memory device 1. Each latch circuit XDL is connected to the sense amplifier unit SAU via a bus DBUS. A plurality of the sense amplifier units SAU may be connected to one latch circuit XDL.

The sense amplifier unit SAU includes, for example, a sense circuit SA and latch circuits SDL, ADL, BDL, CDL, DDL, and TDL. The sense circuit SA and the latch circuits SDL, ADL, BDL, CDL, DDL, and TDL are commonly connected to a bus LBUS. In other words, the latch circuit XDL, the sense circuit SA, and the latch circuits SDL, ADL, BDL, CDL, DDL, and TDL are connected to each other for communication of data.

During a read operation, the sense circuit SA senses the data read from the connected bit line BL, and determines whether the read data is data of "0" or data of "1". In addition, the sense circuit SA applies a voltage to the bit line BL based on the data stored in the latch circuit SDL during a write operation.

The latch circuits SDL, ADL, BDL, CDL, DDL, and TDL temporarily store the read data and the write data. For example, during the read operation, the data may be transferred from the sense circuit SA to any of the latch circuits SDL, ADL, BDL, CDL, DDL, and TDL. In addition, during the write operation, the data may be transferred from the latch circuit XDL to any of the latch circuits SDL, ADL, BDL, CDL, DDL, and TDL.

Each sense amplifier unit SAU is connected to a plurality of strings STR via one bit line BL to which the sense amplifier unit SAU is connected. Hereinafter, the string STR connected to a certain latch circuit SDL via the bit line BL may be referred to as a "corresponding" string STR of the latch circuit SDL. Similarly, the latch circuit SDL connected to a certain string STR may be referred to as a latch circuit SDL "corresponding to" the string STR. The same applies to the other latch circuits BDL, CDL, DDL, and TDL.

1.1.5. Structure of Memory Cell Array

Figure 4:
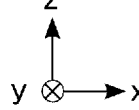
FIG. 4 shows a structure of a part of a memory cell array of the memory device according to the first embodiment.

Each block BLK may have any structure as long as the circuit shown in FIGS. 2 and 3 is achieved. As an example, each block BLK may have a structure shown in FIG. 4. FIG. 4 schematically shows a structure of a part of a memory cell array of the memory device 1 according to the first embodiment.

As shown in FIG. 4, an insulator INS is provided on an upper surface of a substrate sub. A conductor CC is provided on an upper surface of the insulator INS. The conductor CC functions as a part of a source line SL.

One conductor CS, a plurality of conductors CW (for example, eight conductors CW), and a conductor CD are provided above the conductor CC. The conductors CS, CW, and CD are arranged along the z axis at intervals in this order and extend along the y axis. The conductors CS, CW, and CD function as the select gate line SGSL, the word lines WL0 to WL7, and the select gate line SGDL of each NAND string NS, respectively.

A memory pillar MP is provided above the conductor CC. The memory pillar MP penetrates the conductors CS, CW, and CD. A lower surface of the memory pillar MP is located in the conductor CC. The memory pillar MP includes an insulator IC, a semiconductor or semiconductor layer SF, a tunnel insulator or tunnel insulator layer IT, a charge storage layer IA, a block insulator or block insulator layer IB, and a conductor or conductor layer CT.

The insulator IC has a columnar shape extending along the z axis and is located at the center of the memory pillar MP. The semiconductor SF covers a side surface of the insulator IC. A part of a lower surface of the semiconductor SF is in contact with the conductor CC. The semiconductor SF functions as a channel region and body of the memory cell transistor MT, the select gate transistor DT, and the select gate transistor ST. The channel region is a region where a channel is formed.

The tunnel insulator IT covers a side surface of the semiconductor SF. The charge storage layer IA is an insulator or a conductor and covers a side surface of the tunnel insulator IT. The block insulator IB covers a side surface of the tunnel insulator IT.

The conductor CT covers an upper surface of the insulator IC and an upper surface of the semiconductor SF.

Upper surfaces of some conductors CT are connected to a conductor CB via a conductive plug CP. The conductor CB extends along the x axis and is arranged along the y axis. The conductor CB functions as the bit line BL.

Portions of the memory pillars MP that intersect with the conductors CS, CW, and CD function as the select gate transistor ST, the memory cell transistor MT, and the select gate transistor DT, respectively.

1.1.6. Storage of Data by Memory Cell Transistor

Figure 5:
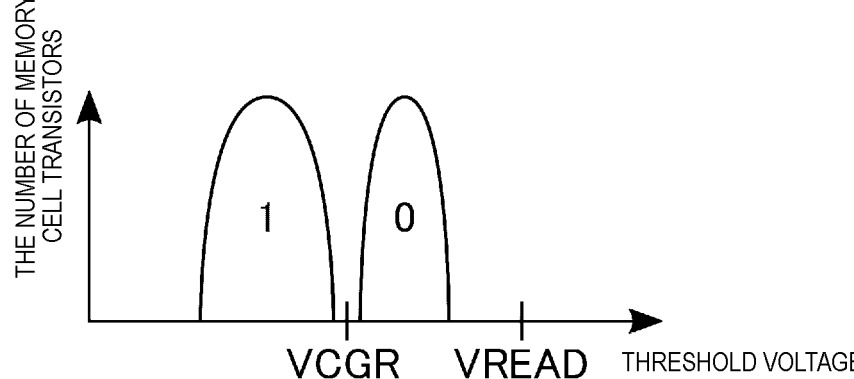
FIG. 5 shows data mapping with a distribution of a threshold voltage of a memory cell transistor of the memory device according to the first embodiment.

The memory device 1 may store two or more bits of data in one memory cell transistor MT. FIG. 5 shows, as an example, data mapping with a distribution of a threshold voltage of the memory cell transistor MT that stores one bit of data per memory cell transistor MT of the memory system 5 of the first embodiment. The threshold voltage of each memory cell transistor MT has a value corresponding to the data to be stored. In a case of storage of one bit per memory cell transistor MT, each memory cell transistor MT may be in one state corresponding to the threshold voltage among two states. The two states are referred to as a state of "1" and a state of "0". The memory cell transistor MT in the state of "0" has a higher threshold voltage than the memory cell transistor MT in the state of "1". The state of "1" corresponds to an erase state.

Through the data writing, the memory cell transistor MT as a write target is maintained in the state of "1" or brought into the state of "0" based on the data to be written.

One bit of data may be assigned to each state in any form. Each state is treated as having, for example, the following one bit data.

State of "1": data of "1"
State of "0": data of "0"

Even a plurality of memory cell transistors MT storing the same one bit data may have different threshold voltages due to variations in characteristics of the memory cell transistors MT and the like.

In order to identify what data is stored by the memory cell transistor MT as a data read target, the state of the memory cell transistor MT as the data read target is determined. A range in which the threshold voltage of the memory cell transistor MT as the data read target is present is used to identify the state of the memory cell transistor MT as the data read target. A read voltage VCGR is used to identify the range of the threshold voltage of the memory cell transistor MT as the data read target. A read pass voltage VREAD is higher than a threshold voltage of any memory cell transistor MT in the state of "0" with a high threshold voltage. A memory cell transistor MT to which the read pass voltage VREAD is applied at its gate, enters an ON state regardless of the data to be stored.

Through the data erasure, the threshold voltage of the cell transistor as an erase target is lowered, and the cell transistor is brought into the state of "1".

1.1.7. String

Figure 6:
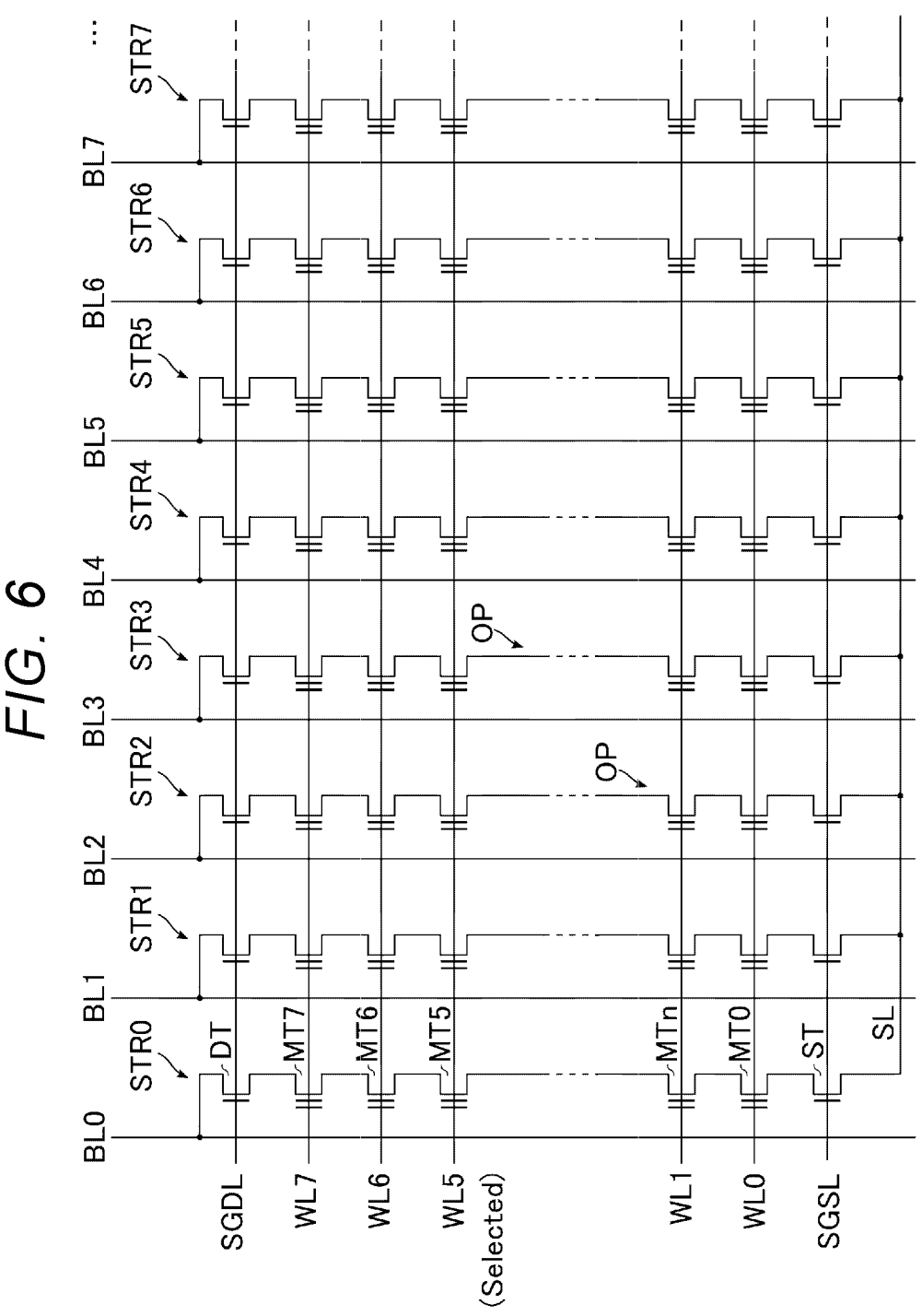
FIG. 6 shows types of string states of the memory device according to the first embodiment.

FIG. 6 shows types of string states of the memory device 1 according to the first embodiment. FIG. 6 shows, as an example, eight strings STR0 to STR7.

The string STR may be in a state where a current may not flow from one end to the other end due to disconnection, foreign matter, or the like. Hereinafter, the state in which a current may not flow from one end to the other end of the string STR may be referred to as an open state. In FIG. 6, as an example, the strings STR2 and STR3 are in an open state. On the other hand, the string lines STR0, STR1, and STR4 to STR7 are in a state where a current may flow from one end to the other end. In the string STR, a portion where the string STR is in an open state due to disconnection, foreign matter, or the like may hereafter be referred to as an open portion OP. The open portion OP may be located at any location of the string STR.

1.2. Operation
1.2.1. Write Operation

Figure 7:
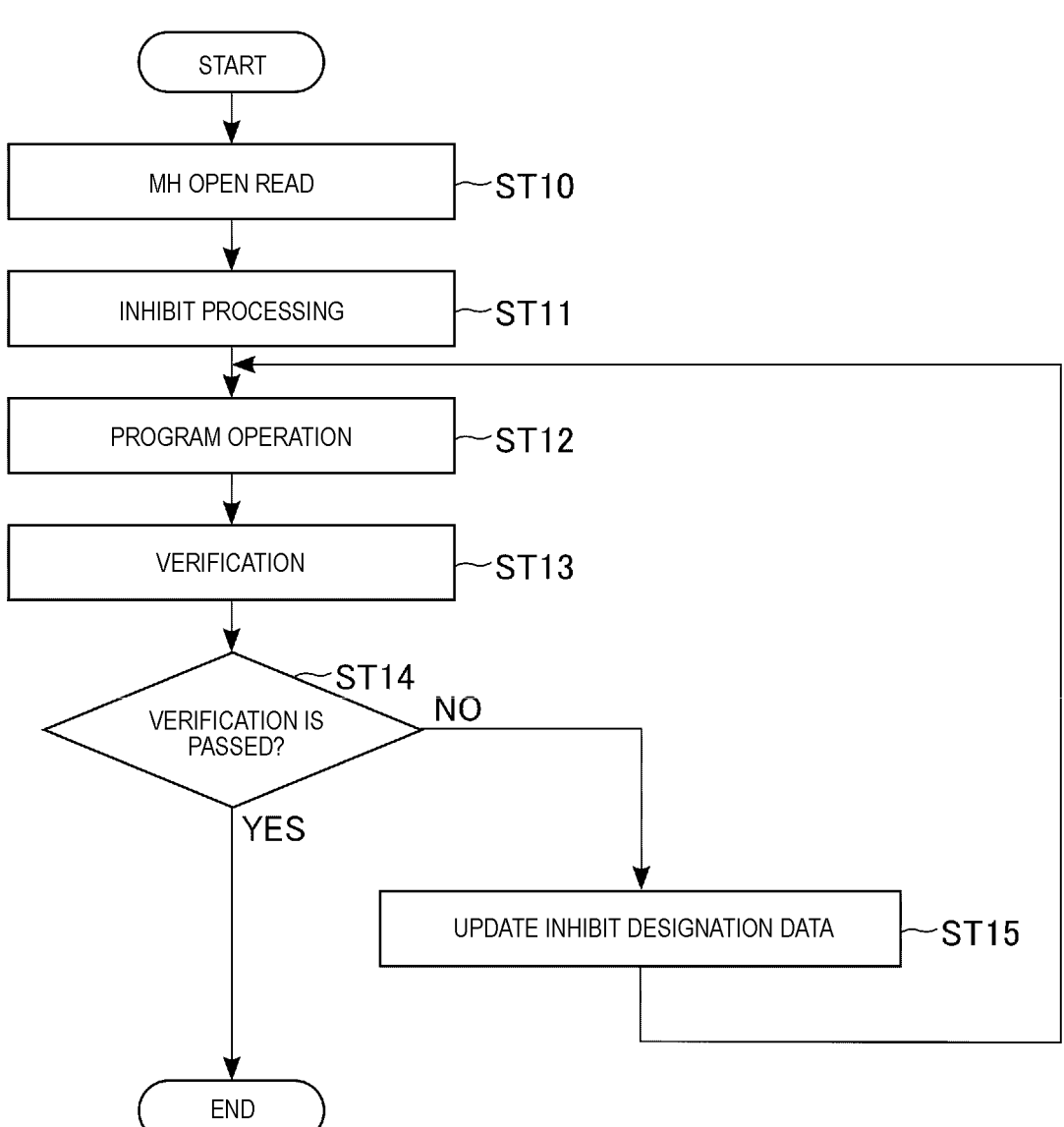
FIG. 7 shows a flow of a write operation performed by the memory device according to the first embodiment.

FIG. 7 shows a flow of the write operation of the memory device 1 according to the first embodiment. The flow in FIG. 7 starts when the memory device 1 receives a data write command and data to be written (hereinafter referred to as write data) for a certain cell unit CU. The cell unit CU as a data write target may be referred to as a select cell unit CU.

Hereinafter, as the string STR in the open state, the strings STR2 and STR3 are used as representatives as described above with reference to FIG. 6. In addition, the description will be made based on an example in which the select cell unit CU is a cell unit CU connected to the word line WL5. Therefore, the word line LW5 is a selected word line (hereinafter referred to as a select word line). The memory cell transistor MT in the select cell unit CU may be referred to as a select memory cell transistor MT.

Figure 8:
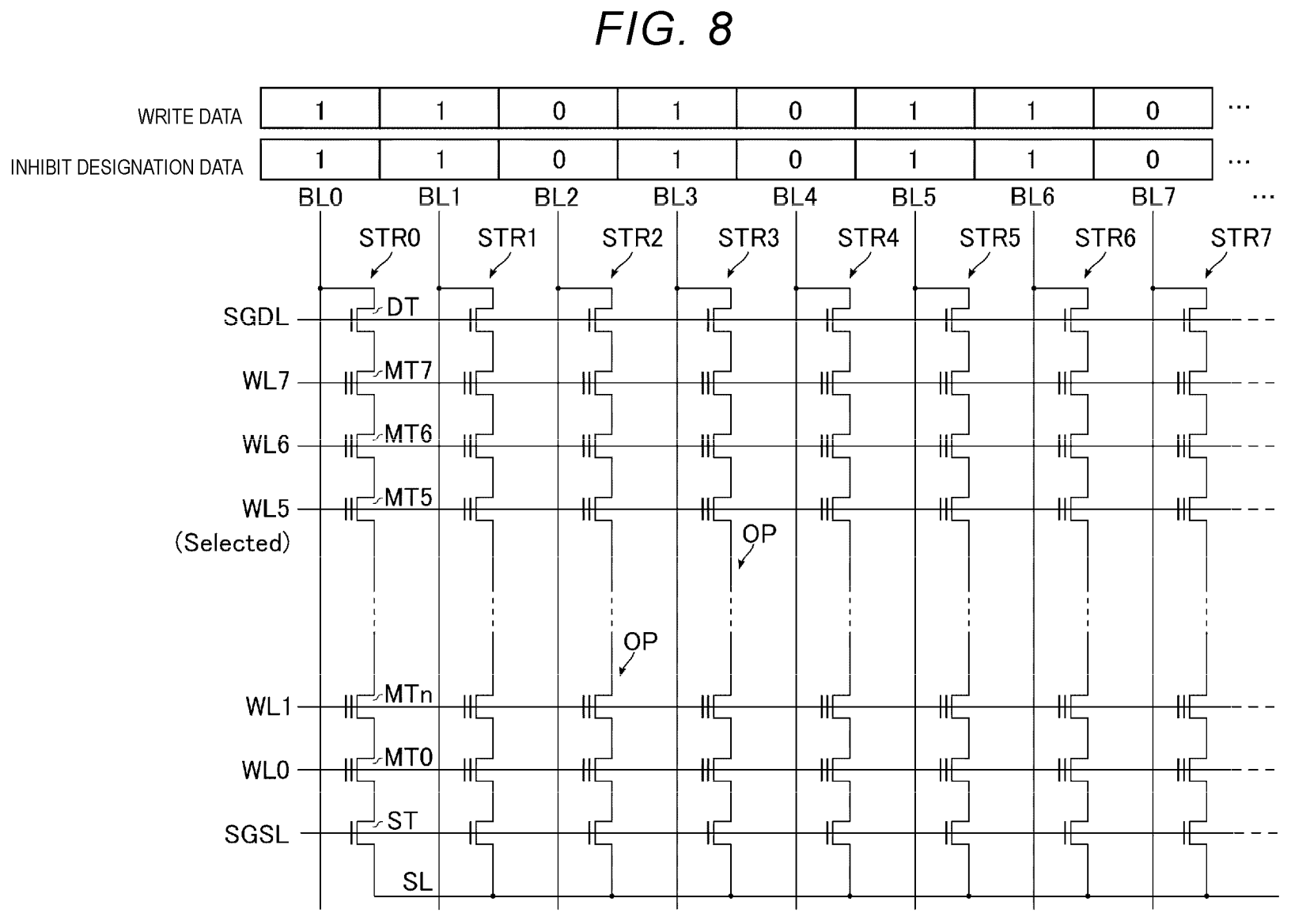

As an example, as shown in FIG. 8, the write data includes data of "1", data of "1", data of "0", data of "1", data of "0", data of "1", data of "1", and data of "0" in the bits written in the select memory cell transistors MT of the strings STR0 to STR7. That is, the write data has 11010110 in order from the string STR0 side in the bits of the portions of the string STR0 to STR7 to be written in the select memory cell transistors MT. A value of each bit of the write data received by the memory device 1 is stored in any of a set including the latch circuits SDL, a set including the latch circuits ADL, a set including the latch circuits BDL, a set including the latch circuits CDL, a set including the latch circuits DDL, and a set including the latch circuits TDL in the sense amplifier 16.

The write data is used as inhibit designation data at the current point in time. The inhibit designation data includes information for designating whether to set each string STR to an inhibit state during a program operation described below. The inhibit state is a state in which the string STR including the memory cell transistor MT in which the threshold voltage is maintained is maintained in a state where a voltage bias that does not increase the threshold voltage of the memory cell transistor MT is applied, during the subsequent program operation. The inhibit designation data corresponds to one string STR in each bit, that is, the inhibition is designated for the corresponding string STR. The inhibit designation data has 11010110 in order from the string STR0 side in the bits indicating the strings STR0 to STR7. The inhibit designation data is stored in any of a set including the latch circuits SDL, a set including the latch circuits ADL, a set including the latch circuits BDL, a set including the latch circuits CDL, a set including the latch circuits DDL, and a set including the latch circuits TDL. The sequencer 13 maintains the designated string STR in the inhibit state based on the inhibit designation data during the subsequent program. For example, the inhibit designation data designates the inhibit state by the data of "1" and designates the programmable state by the data of "0".

As described above, the strings STR0 to STR7 function as representatives of the types of strings STR shown below in the following description.

The strings STR0, STR1, STR5, and STR6 represent strings STR that are not in the open state and include the select memory cell transistor MT into which the data of "1" is written.

The strings STR4 and STR7 represent strings STR that are not in the open state and include the select memory cell transistor MT into which the data of "0" is written.

The string STR2 represents a string STR that is in the open state and includes the select memory cell transistor MT into which the data of "0" is written.

The string STR3 represents a string STR that is in the open state and includes the select memory cell transistor MT into which the data of "1" is written.

Referring again to FIG. 7, the description will be given. The sequencer 13 performs MH open read (ST10). The MH open read refers to a read for specifying the string STR in the open state among the strings STR including the select memory cell transistor MT. The MH open read applies a voltage to the string STR to specify the string STR in the open state based on whether a current flows through the string STR. Specifically, the processing is performed as follows.

Figure 9:
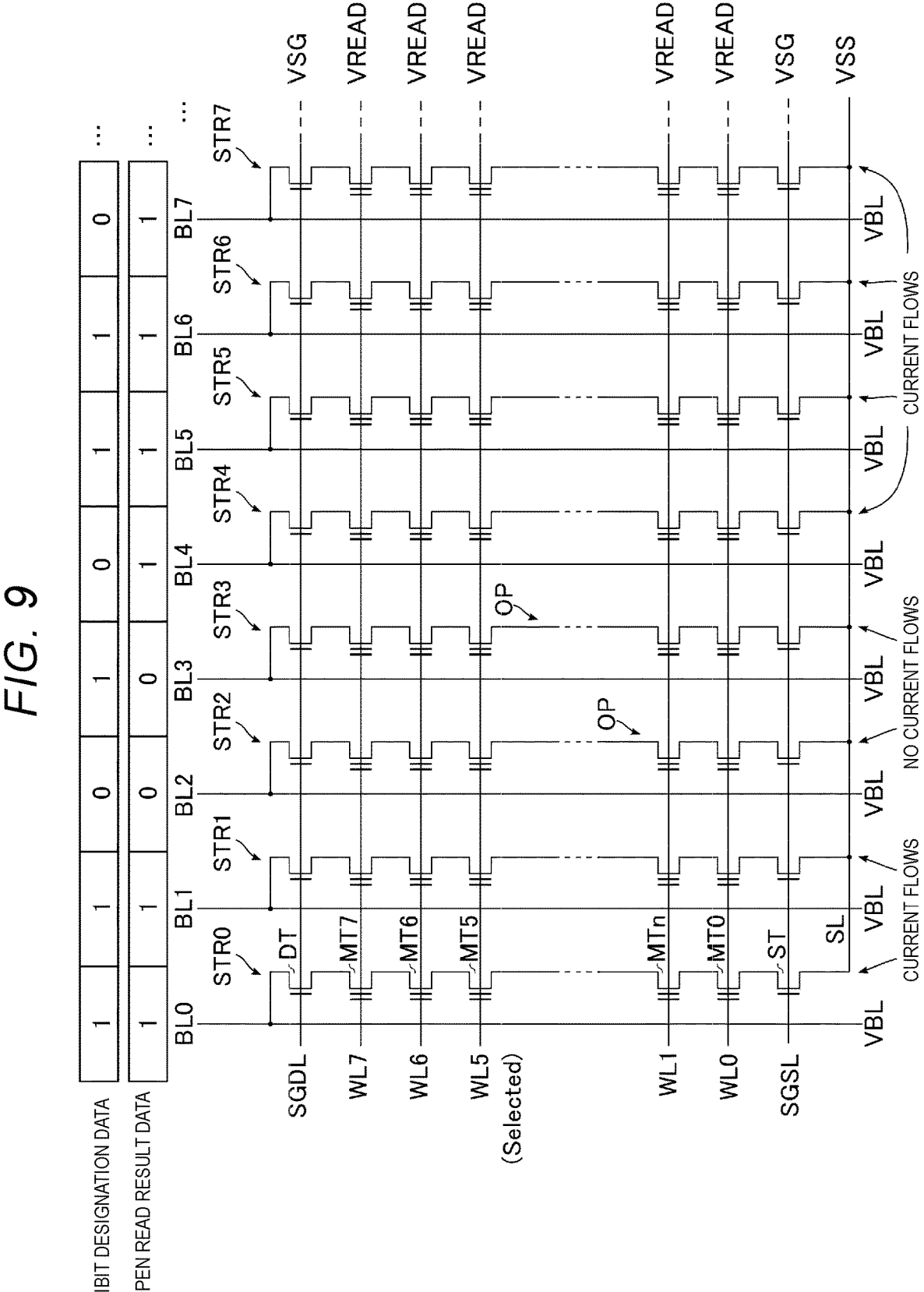
FIG. 9 shows internal data and a voltage applied to a wiring during MH open read in the memory device according to the first embodiment.

FIG. 9 shows internal data and a voltage applied to a wiring during the MH open read in the memory device 1 according to the first embodiment. The sequencer 13 controls the driver 14 and the row decoder 15 to apply the voltages described below to the wirings.

As shown in FIG. 9, a ground voltage VSS is applied to the source line SL, and a voltage VSG is applied to the select gate lines SGDL and SGSL. The voltage VSG has a magnitude for maintaining the select gate transistors DT and ST on. A voltage VBL is applied to the bit line BL. The voltage VBL is higher than the ground voltage VSS. The read pass voltage VREAD is applied to the word lines WL0 to WL7.

By applying the voltages as described above, the memory cell transistor MT and the select gate transistors DT and ST enter an ON state. Therefore, a current flows through the strings STR0, STR1, and STR4 to STR7 that are not in the open state. On the other hand, no current flows through the strings STR2 and STR3 in the open state. For each string STR, the data based on whether a current flows is stored in any of a set including the latch circuits SDL, a set including the latch circuits ADL, a set including the latch circuits BDL, a set including the latch circuits CDL, a set including the latch circuits DDL, and a set including the latch circuits TDL, which are connected to the string STR. For example, the data based on whether a current flows is stored in a set of the latch circuits different from the set including the latch circuits SDL, for example, in a set including the latch circuits ADL. The data based on whether a current flows functions as data indicating a result of the MH open read (hereinafter referred to as MH open read result data). The data of each latch circuit ADL stores the result of the MH open read for the string STR corresponding to the latch circuit ADL. For example, the result of the MH open read indicates that the corresponding string STR is in the open state when it is data of "0", and that the corresponding string STR is not in the open state when it is data of "1".

As a result of step ST10, the MH open read result data has 11001111 in order from the string STR0 side in the bits indicating the strings STR0 to STR7. That is, the latch circuits ADL corresponding to the strings STR2 and STR3 store data of "0", and the latch circuits ADL corresponding to the strings STR0, STR1, and STR4 to STR7 store data of "1".

Referring again to FIG. 7, the description will be given. The sequencer 13 performs inhibit processing (ST11). The inhibition processing refers to setting a specific string STR to an inhibit state based on the MH open read result data. Specifically, the processing is performed as follows.

FIG. 10 shows internal data during the inhibit processing by the memory device 1 according to the first embodiment. As shown in FIG. 10, the bit of the data of "0" in the MH open read result data goes into data of "1" in the bits of the inhibit designation data regardless of the value of the write data. That is, the bit corresponding to the string STR2 in the inhibit designation data is changed to data of "1". In addition, since the bit corresponding to the string STR3 in the inhibit designation data is originally data of "1", the data of "1" is maintained. In the inhibit designation data, bits having the data of "1" in the MH open read result data maintain their values. As a result, the inhibit designation data has data of "0" in the bit into which the data of "1" is written and the bit indicating the string STR in the open state at the current point in time. As a result of the operation of the data as described above, the inhibit designation data has 11110110 in order from the string STR0 side in the bits indicating the strings STR0 to STR7.

Referring again to FIG. 7, the description will be given. The sequencer 13 performs a program operation (ST12). The program operation refers to applying a voltage to the wiring to increase the threshold voltage of a specific select memory cell transistor MT and to maintain the threshold voltage of another select memory cell transistor MT. The program operation is based on the inhibit designation data. Specifically, the processing is performed as follows.

Figure 11:
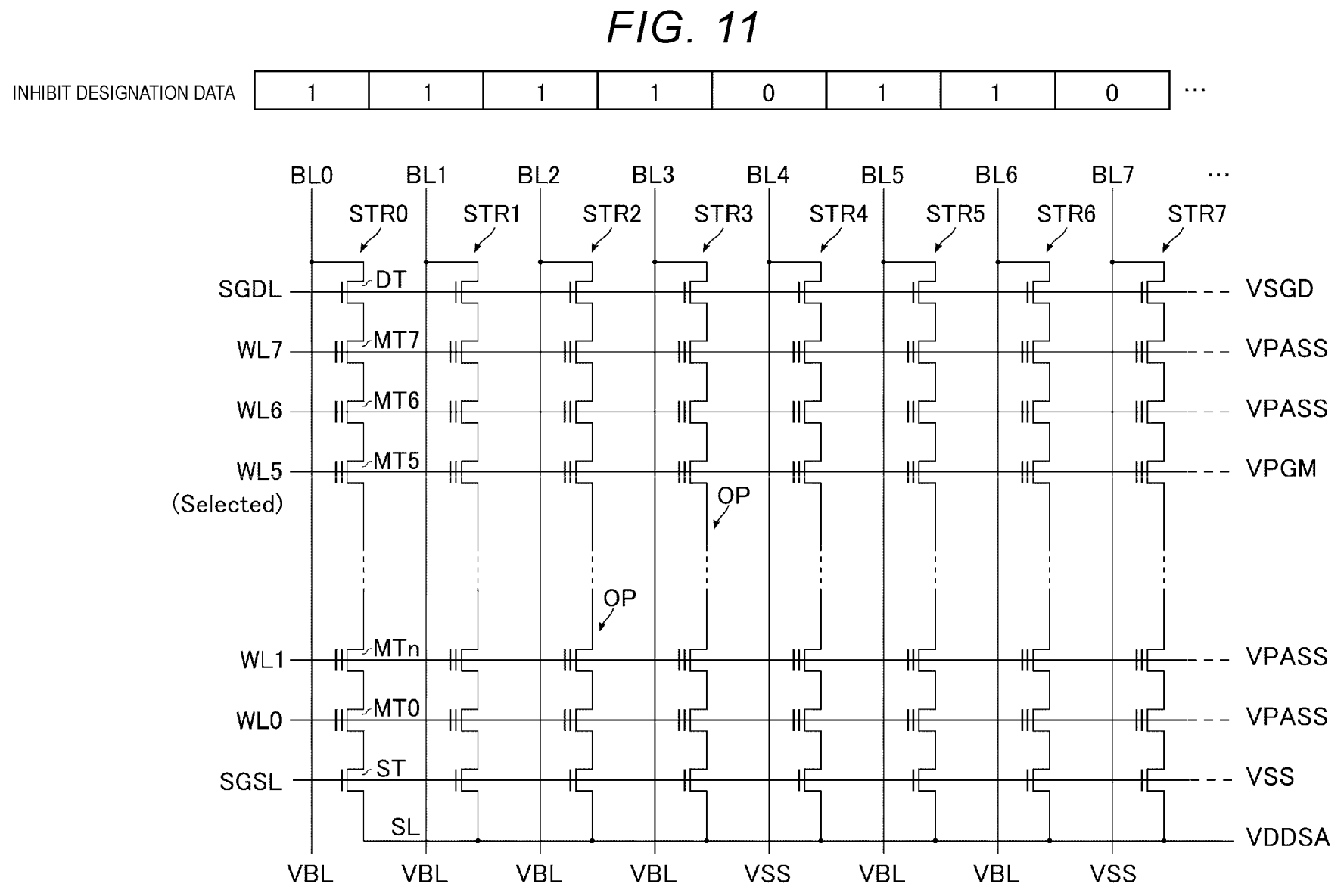

FIG. 11 shows internal data and a voltage applied to a wiring during the program operation by the memory device 1 according to the first embodiment. As shown in FIG. 11, a voltage VSGD is applied to the select gate line SGDL. The voltage VSGD has a magnitude for turning on the select gate transistor DT and is higher than the ground voltage VSS. The ground voltage VSS is applied to the select gate line SGSL. A voltage VDDSA is applied to the source line SL.

In addition, the voltage VDDSA is applied to the bit line BL connected to the string STR indicated by the bit having the data of "1" in the inhibit designation data. That is, the voltage VDDSA is applied to the bit lines BL0, BL1, BL2, BL3, BL5, and BL6. The voltage VDDSA is higher than the ground voltage VSS. The strings STR0, STR1, STR2, STR3, ST5, and STR6 connected to the bit line BL to which the voltage VDDSA is applied are in the inhibit state. That is, the select memory cell transistors MT in the strings STR0, STR1, STR2, STR3, ST5, and STR6 are in a state where the threshold voltage is hardly increased or maintained even by the application of a program voltage VPGM described below.

On the other hand, the voltage VSS is applied to the bit line BL connected to the string STR indicated by the bit having the data of "0" in the inhibit designation data. That is, the ground voltage VSS is applied to the bit lines BL4 and BL7. The strings STR4 and STR7 connected to the bit line BL to which the voltage VSS is applied are in the programmable state. That is, the select memory cell transistors MT in the strings STR4 and STR7 are in a state where the threshold voltage is increased by the application of a program voltage VPGM described below.

In a state where the voltages described so far are applied, the program voltage VPGM is applied to the select word line WL, and a program pass voltage VPASS is applied to the word line WL other than the select word line WL. The program voltage VPGM is higher than the read pass voltage VREAD and the voltage VDDSA. The program pass voltage VPASS is higher than the ground voltage VSS and lower than the program voltage VPGM.

By applying the voltage to the word line WL, the threshold voltage of the select memory cell transistor MT increases in the strings STR4 and STR7 in the programmable state. On the other hand, in the strings STR0, STR1, STR2, STR3, ST5, and STR6 in the inhibit state, the threshold voltage of the select memory cell transistor MT increases little or not at all.

Referring again to FIG. 7, the description will be given. The sequencer 13 performs a verify operation (ST13). The verify operation refers to an operation of checking whether the select memory cell transistor MT has a threshold voltage of a magnitude based on the write data. The verify operation is the same as the read operation except for the difference in the voltage applied to the select word line WL. That is, in the verify operation, the read operation using a verify voltage is performed, and it is checked whether the select memory cell transistor MT of the string STR in the programmable state has the threshold voltage exceeding the verify voltage.

Figure 12:
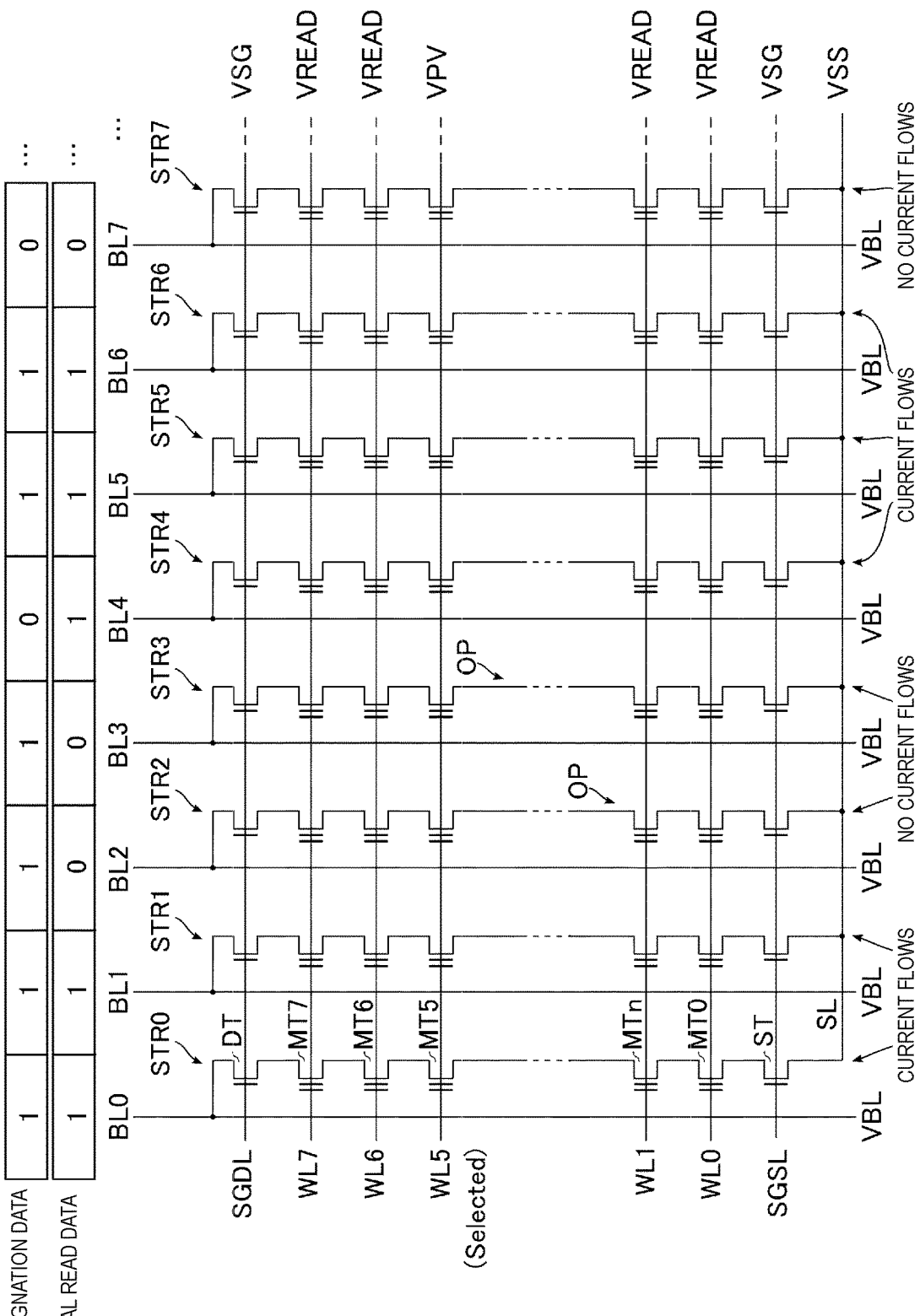
FIG. 12 shows internal data and a voltage applied to a wiring during a verify operation performed by the memory device according to the first embodiment.

FIG. 12 shows internal data and a voltage applied to a wiring during the verify operation by the memory device 1 according to the first embodiment. As shown in FIG. 12, the voltage VSG is applied to the select gate line SGDL. The ground voltage VSS is applied to the select gate line SGSL. A verify voltage VPV is applied to the select word line WL, and the read pass voltage VREAD is applied to the word line WL other than the select word line WL. As a result, a state where a current may flow through the string STR is formed. When a certain select memory cell transistor MT has a threshold voltage equal to or lower than the verify voltage VPV by the application of the voltages to the select gate lines SGDL and SGSL and the word line WL, the select memory cell transistor MT is in an ON state. Therefore, a current flows through the string STR including the select memory cell transistor MT in the ON state. On the other hand, when a certain select memory cell transistor MT has a threshold voltage exceeding the verify voltage VPV, the select memory cell transistor MT is in an OFF state. Therefore, no current flows through the string STR including the select memory cell transistor MT in the OFF state.

In the sense circuit SA, each sense amplifier unit SAU stores the determined data of the select memory cell transistor MT connected to the sense amplifier unit SAU based on whether a current flows. For example, when a current flows, the sense amplifier unit SAU determines that the select memory cell transistor MT connected to the sense amplifier unit SAU has data of "1", and stores the data of "1" inside. On the other hand, when no current flows, the sense amplifier unit SAU determines that the select memory cell transistor MT connected to the sense amplifier unit SAU has data of "0", and stores the data of "0" inside. A current flows through the strings STR0, STR1, and STR4 to STR6, but not through the string STR7. Therefore, the internal read data has data of "1" in the bits indicating the strings STR0, STR1, and STR4 to STR6, and has data of "0" in the bits indicating the string STR7. Since the strings STR2 and STR3 are in the open state, no current flows through the strings STR2 and STR3 regardless of the state of the select memory cell transistor MT. Therefore, the internal read data has data of "0" in the bits indicating the strings STR2 and STR3. The internal read data is stored in any of a set including the latch circuits SDL, a set including the latch circuits ADL, a set including the latch circuits BDL, a set including the latch circuits CDL, a set including the latch circuits DDL, and a set including the latch circuits TDL. The internal read data is stored in a set including the latch circuits different from the set including latch circuits that stores the inhibit designation data and the MH open read result data, for example, in a set including the latch circuits BDL.

Figure 13:
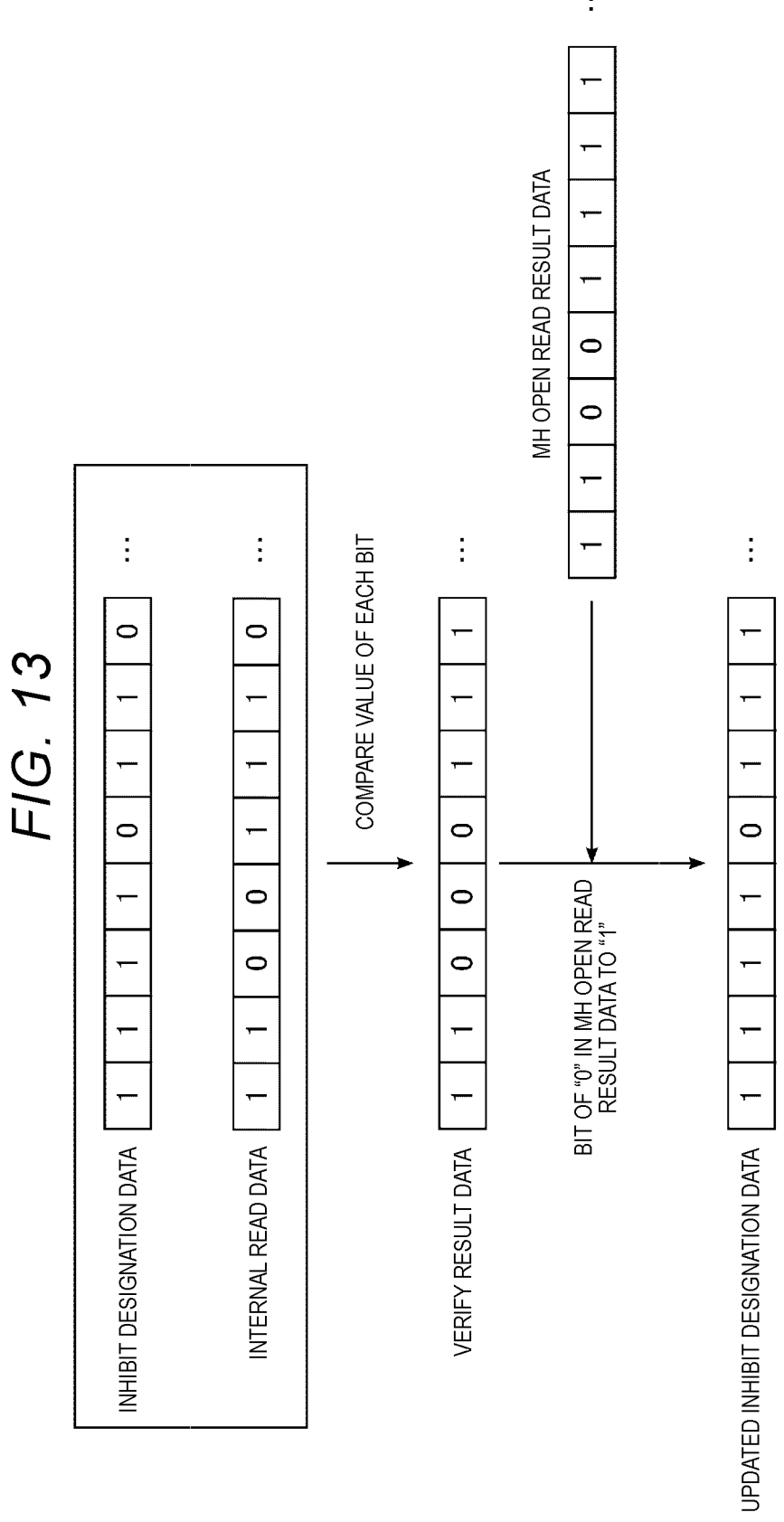
FIG. 13 shows internal data during update of inhibit designation data performed by the memory device according to the first embodiment.

Next, the sense amplifier unit SAU obtains a result of the verification based on the internal read data and the write data. The write data is reflected in the inhibit designation data, so that the internal read data and the inhibit designation data are compared with each other. That is, as shown in FIG. 13, the sense amplifier unit SAU stores data of "1" as the result of the verify operation when the internal read data matches the write data, for each bit. On the other hand, when the internal read data does not match the write data, the sense amplifier unit SAU stores data of "0" as the result of the verify operation. The verify result data is stored in any of a set including the latch circuits SDL, a set including the latch circuits ADL, a set including the latch circuits BDL, a set including the latch circuits CDL, a set including the latch circuits DDL, and a set including the latch circuits TDL.

FIG. 13 shows a state where the threshold voltage of the select memory cell transistor MT of the string STR7 is greater than the verify voltage VPV, as an example. On the other hand, the threshold voltage of the select memory cell transistor MT of the string STR4 has not yet exceeded the verify voltage VPV. The internal read data has data of "1" in the bits indicating the strings STR0, STR1, and STR5 to STR7. Therefore, the bits indicating the strings STR0, STR1, and STR5 to STR7 have the same data between inhibit designation data and the internal read data. Therefore, it is determined that writing is completed for the strings STR0, STR1, and STR5 to STR7, and the verify result data has data of "1" in the bits indicating the strings STR0, STR1, and STR5 to STR7. On the other hand, the bits indicating the string STR4 have different data between the inhibit designation data and the internal read data. Therefore, it is determined that the writing is not completed for the string STR4, and the verify result data has data of "0" in the bits indicating the string STR4.

Since the strings STR2 and STR3 are in the open state, no current flows therethrough. Therefore, the internal read data has data of "0" in the bits indicating the strings STR2 and STR3. This value is different from the values of the bits indicating the strings STR2 and STR3 of the inhibition designation data. Therefore, the verify result data has data of "0" in the bits indicating the strings STR2 and STR3. As described above, the string STR in the open state goes into data of "0" in the verify result data.

From the above, the verify result data has 11000111 in order from the string STR0 side in the bits indicating the strings STR0 to STR7. In this case, for each bit, the data is data of "1" when the inhibit designation data matches the internal read data, and the data is data of "0" when the inhibit specification data does not match the internal read data.

Referring again to FIG. 7, the description will be given. The sequencer 13 determines whether the verification of the write operation to the selection cell unit CU is passed (ST14). For example, when it is determined that the number of bits of the data of "1" in the verify result data exceeds the number of a certain proportion of the total number of the select memory cell transistors MT, it is determined that the verification is passed. As shown in FIG. 13, the inhibit designation data is 11110110 in order from the string STR0 side, and the verify result data is 11001110 in order from the string STR0 side. The verify result data is data of "0" in the bits indicating STR2, STR3, and STR4. Meanwhile, the selection cell unit CU includes several hundreds of select memory cell transistors MT, and the verification is passed when the data written in the selection cell unit CU is sufficiently consistent with the write data. As shown in FIG. 7, when the verification is passed (ST14, Yes), the write operation shown in FIG. 7 ends.

On the other hand, when the verification fails (ST14, No), the sequencer 13 updates the inhibit designation data (ST15). As shown in FIG. 13, the sequencer 13 updates the inhibit designation data based on the verify result data.

As a result, the inhibit designation data has 11000111 in order from the string STR0 side in the bits indicating the strings STR0 to STR7.

The update of the inhibit designation data is also based on the MH open read result data. The MH open read result data has data of "0" in the bits indicating the strings STR2 and STR3 in the open state. That is, the MH open read result data has 11001111 in order from the string STR0 side. Based on this, the inhibition designation data is updated to data of "1" in the bits having data of "0" in the MH open read result data, that is, in the bits indicating the strings STR2 and STR3. As described above, the updated inhibit designation data goes into 11110111 in order from the string STR0 side.

Referring again to FIG. 7, the description will be given. Step ST15 continues to step ST12. In step ST12, the string STR enters the inhibit state or the programmable state based on the inhibit designation data updated in step ST15. Therefore, the strings STR2 and STR3 in the open state are maintained in the inhibit state until the end of the write operation, regardless of the write data.

1.2.2. Read Operation

Figure 14:
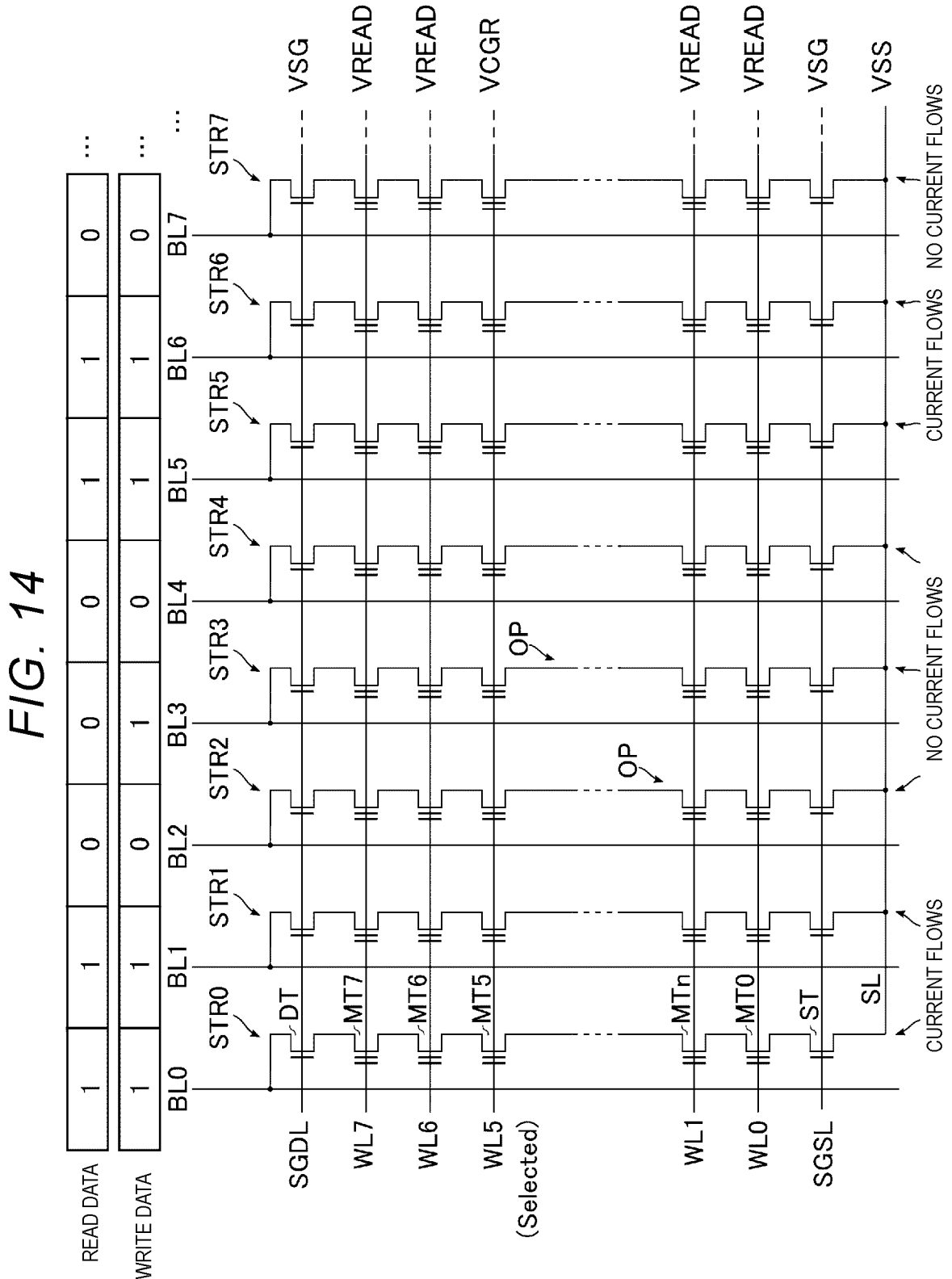
FIG. 14 shows a voltage applied to a wiring and related data during a read operation performed by the memory device according to the first embodiment.

FIG. 14 shows a voltage applied to a wiring and related data during the read operation by the memory device 1 according to the first embodiment. FIG. 14 relates to a read operation for the cell unit CU on which the write operation described above is performed with reference to FIGS. 7 to 13.

As shown in FIG. 14, a ground voltage VSS is applied to the source line SL, and a voltage VSG is applied to the select gate lines SGDL and SGSL. A voltage VBL is applied to the bit line BL. A read voltage VCGR is applied to the select word line WL5. The read pass voltage VREAD is applied to the word line WL other than the select word line WL5. By applying such a voltage for reading, data based on the state of the select memory cell transistor MT connected to the sense amplifier unit SAU is stored in each sense amplifier unit SAU.

The select memory cell transistors MT of the strings STR0, STR1, and STR4 to STR7, which are not in the open state, respectively have data of "1", data of "1", data of "0", data of "1", data of "1", and data of "0" written therein, and as a result of the write operation, the select memory cell transistors MT are respectively correctly brought into a state of "1", a state of "1", a state of "0", a state of "1", a state of "1", and a state of "0". Therefore, by applying a voltage for reading, a current flows through the strings STR0, STR1, STR5, and STR6, and no current flows through the strings STR4 and STR7. Based on this, the sense amplifier units SAU of the strings STR0, STR1, and STR4 to STR7 have data of "1", data of "1", data of "0", data of "1", data of "1", and data of "0" as the read data, respectively.

On the other hand, even by applying a voltage for reading, no current flows through the strings STR2 and STR3 in the open state. Therefore, the sense amplifier units SAU connected to the string STR2 and the string STR3 both have data of "0" as the read data.

From the above, the read data has 11000110 in order from the string STR0 side in the bits indicating the strings STR0 to STR7. The original write data is 11010110 in order from the string STR0 side in FIG. 8. Meanwhile, the bit sequence is different from the bit sequence in the write data in the bits indicating the string STR3. This is because no current flows through the string STR3 in the read operation and the bit is determined as "0". Therefore, the read data includes an error in the bit indicating the select memory cell transistor MT of the string STR3. Meanwhile, the probability of the occurrence of the open state is low, and thus the number of error bits caused by the occurrence of the open state is small in the data read from one cell unit CU. Therefore, the error bit caused by the occurrence of the open state can be corrected by the error correction circuit 26 of the memory controller 2.

Since the string STR2 is also in the open state and no current flows therethrough, the read data has data of "0" in the bit indicating the select memory cell transistor MT of the string STR2. This is the same as the bit indicating the select memory cell transistor MT of the string STR2 of the write data. As described above, even when the string STR is in the open state, if the write data to the select memory cell transistor MT is data of "0", no mismatch between the write data and the read data occurs. In addition, the read data includes the error bit due to the occurrence of the open state only when the write data is "1". Therefore, even if the error bit occurs in the read data due to the occurrence of the open state, the proportion thereof is small, and the error bit is corrected by the error correction circuit 26.

1.3. Advantages (Effects)

According to the first embodiment, as described below, the memory device 1 in which deterioration of the memory cell transistor MT is prevented can be provided.

As described above with reference to FIG. 6, the string STR may be in the open state. When data of "0" is written into the select memory cell transistor MT in the string STR in the open state, if the same voltage as the voltage for the string STR that is not in the open portion state is applied to the string STR that is in the open state, the following phenomenon may occur in the string STR in the open state. That is, a high voltage is applied to the select memory cell transistor MT into which data of "0" is written (that is, of which the threshold voltage is increased) by the application of the bias voltage, across the word line WL and the channel region. When such a high voltage is repeatedly applied to the string STR in the open state, the insulator deteriorates in the vicinity of the open portion OP, and a path of a leakage current may be unintentionally formed between the semiconductor SF and the word line WL. When such a current path is formed, no matter how much voltage is applied to the word line WL connected to the current path, the charge flows out via the current path. Therefore, the voltage of the word line WL does not rise. This means that the memory device cannot operate normally.

According to the first embodiment, before the program operation, the string STR in the open state is specified, and the specified string STR is maintained in the inhibit state regardless of the data to be written during the program operation. Therefore, repeated application of the high voltage to the select memory cell transistor MT of the string STR in the open state is prevented. Therefore, the memory device 1 can be prevented from reaching a state where the memory device 1 cannot operate normally due to the deterioration of the insulator in the vicinity of the open portion OP.

2. Second Embodiment

A memory device 1b and a memory controller 2b according to a second embodiment include the same elements as the memory device 1 and the memory controller 2 according to the first embodiment, respectively. On the other hand, the memory device 1b and the memory controller 2b according to the second embodiment perform operations described below. The memory controller 2b includes a program executed by the CPU 22 to perform an operation described below in the ROM 24. A sequencer 13b of the memory device 1b performs an operation described below.

Figure 15:
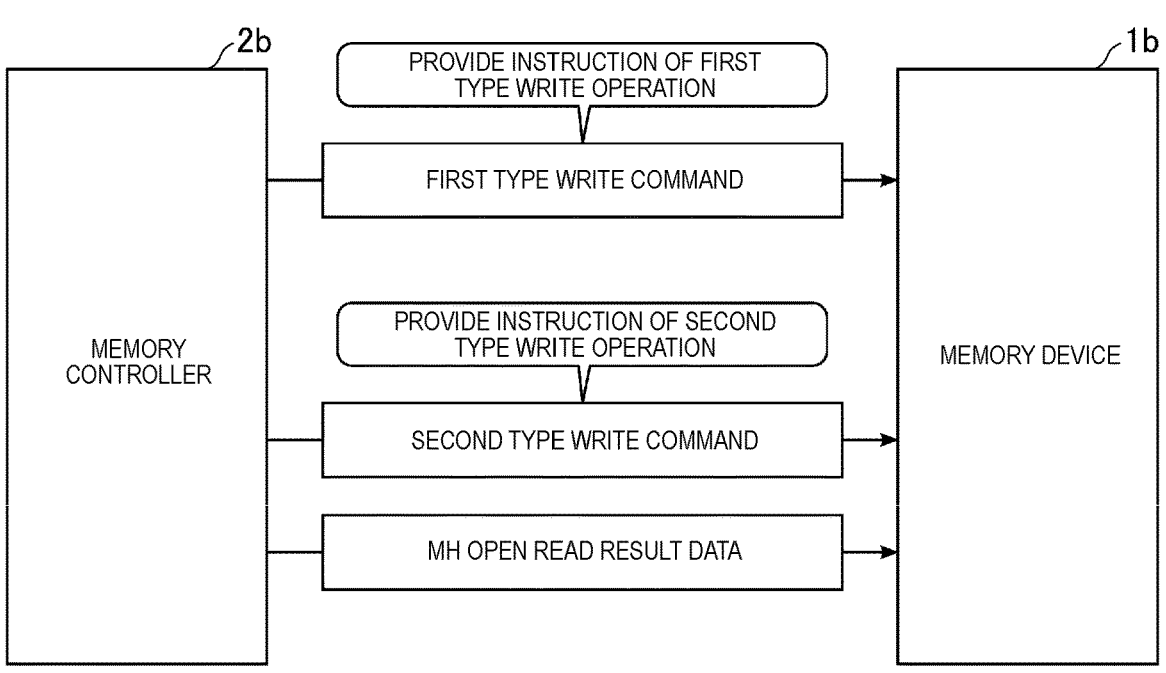
FIG. 15 shows a signal received by a memory device according to a second embodiment.

As shown in FIG. 15, the memory controller 2b may issue two types of write commands. A first type write command is used for instructing the memory device 1b that has received the first type write command to execute the write operation described above in the first embodiment. The write operation described above in the first embodiment may be referred to as a first type write operation.

A second type write command is used for instructing the memory device 1b that has received the second type write command to execute a second type write operation. The second type write command is accompanied by transmission of the MH open read result data for the select cell unit CU as a write target. That is, the memory controller 2*b* transmits a write instruction to the select cell unit CU to the memory device 1*b* together with the MH open read result data for the select cell unit CU.

After transmitting the first type write command, the memory controller 2*b* receives the MH open read result data from the memory device 1*b* for the selection cell unit CU which is a target of the first type write command. The memory device 1*b* is instructed to transmit the MH open read result data by, for example, a dedicated command. The memory controller 2*b* stores the received MH open read result data in, for example, the RAM 23.

Figure 16:
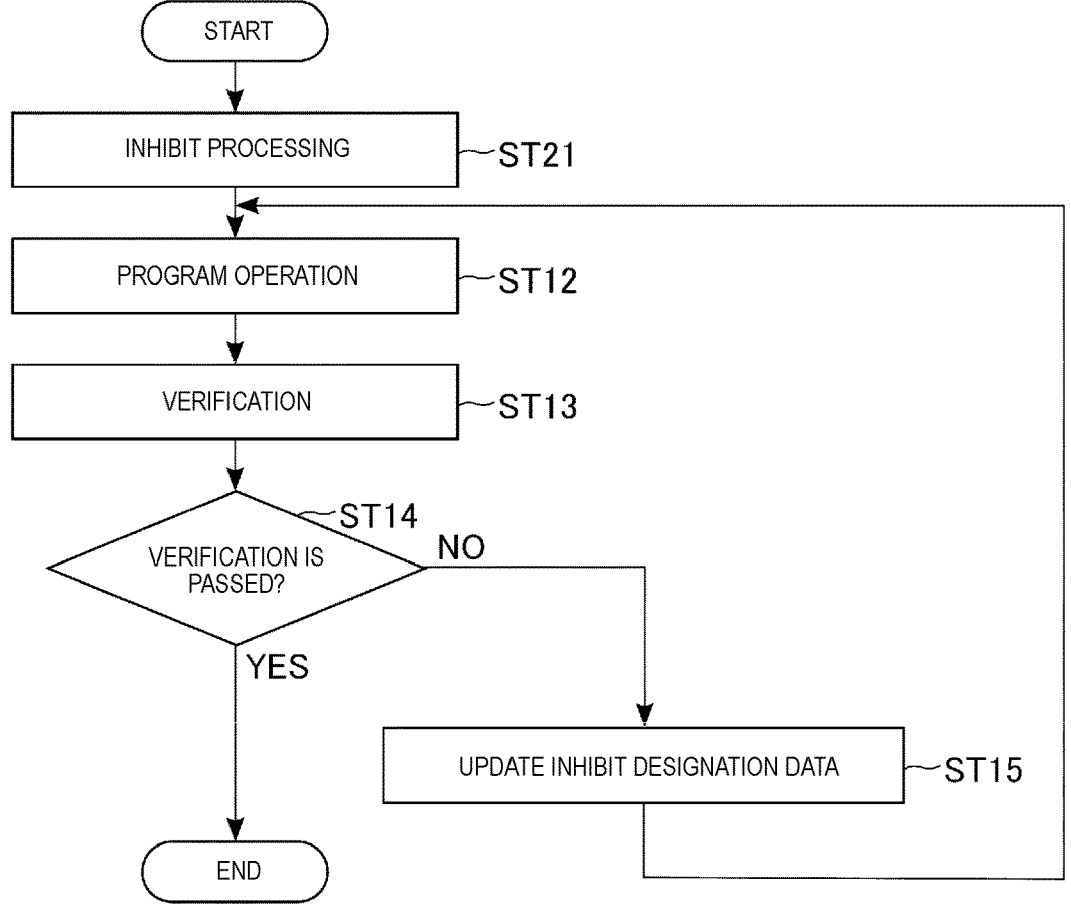
FIG. 16 shows a flow of a write operation performed by the memory device according to the second embodiment.

FIG. 16 shows a flow of a write operation of the memory device 1*b* according to the second embodiment, and shows a flow of the second type write operation. The flow of FIG. 16 starts when the memory device 1*b* receives the second type write command and the MH open read result data. The MH open read result data is stored in any of a set including the latch circuits SDL, a set including the latch circuits ADL, a set including the latch circuits BDL, a set including the latch circuits CDL, a set including the latch circuits DDL, and a set including the latch circuits TDL.

As shown in FIG. 16, when the flow is started, the memory device 1*b* performs the inhibit processing (ST21). The inhibit processing of the second embodiment refers to setting a specific string STR to an inhibit state based on the MH open read result data, as in the inhibit processing (ST10) of the first embodiment. On the other hand, in the inhibit processing of the second embodiment, the MH open read result data received from the memory controller 2*b* is used.

Step ST21 continues to step ST12. Step ST12 and subsequent operations are the same as the flow in the first embodiment (refer to FIG. 7).

According to the second embodiment, as in the first embodiment, the string STR in the open state is maintained in the inhibit state during the program operation regardless of the data to be written. Therefore, the same advantages as the first embodiment may be obtained.

2. Other Embodiments

The above embodiment can be applied even when a plurality of bits can be stored per memory cell transistor MT.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method performed by a memory device that includes:
   a first memory string including a plurality of memory cell transistors that are connected in series,
   a second memory string including a plurality of memory cell transistors that are connected in series,
   a first wiring connected to one end of the first memory string,
   a second wiring connected to one end of the second memory string, and a third wiring connected to the other end of the first memory string and the other end of the second memory string, the method comprising:
   executing a write operation on a first memory cell transistor, which is one of the memory cell transistors of the first memory string, and a second memory cell transistor, which is one of the memory cell transistors of the second memory string, the write operation including:
      a first operation by which a first voltage is applied to the first and second wirings, and
      a second operation by which a second voltage is applied to gates of the first and second memory cell transistors, wherein
   the second operation includes:
      upon detection of a current flowing between each of the first and second wirings and the third wiring in the first operation, applying a third voltage to the first and second wirings, and
      upon detection of a current flowing between the first and third wirings in the absence of a current between the second and third wirings in the first operation, applying the third voltage to the first wiring, and applying a fourth voltage higher than the third voltage and lower than the second voltage to the second wiring.

2. The method according to claim 1, wherein, upon detection of a current flowing between the first and third wirings in the absence of a current between the second and third wirings in the first operation, data is written into the first memory cell transistor but is not written into the second memory cell transistor by the second operation.

3. The method according to claim 1, wherein the second voltage has a magnitude for increasing threshold voltages of the first and second memory cell transistors.

4. The method according to claim 1, wherein the third voltage is a ground voltage.

5. The method according to claim 1, wherein
   the first operation includes applying a fifth voltage lower than the second voltage to gates of the memory cell transistors of the first and second memory strings, and applying the third voltage to the third wiring,
   the fifth voltage has a magnitude for turning on the memory cell transistors of the first and second memory strings, and
   the first voltage is higher than the third voltage.

6. The method according to claim 1, wherein
   the first memory string includes a first transistor at said one end of the first memory string and a second transistor at the other end of the first memory string,
   the second memory string includes a third transistor at said one end of the second memory string and a fourth transistor at the other end of the second memory string, and
   the second operation includes applying a sixth voltage to gates of the first and third transistors, and applying the third voltage to gates of the second and fourth transistors.

7. The method according to claim 6, wherein
   the first operation includes:
      applying a fifth voltage lower than the second voltage to gates of the memory cell transistors of the first and second memory strings,
      applying a seventh voltage to the gates of the first, second, third, and fourth transistors, and
      applying the third voltage to the third wiring, the fifth voltage has a magnitude for turning on the memory cell transistors of the first and second memory strings, the first voltage is higher than the third voltage, and the seventh voltage has a magnitude for turning on the first, second, third, and fourth transistors.

8. The method according to claim 1, wherein the memory device includes a first latch circuit connected to the first wiring and a second latch circuit connected to the second wiring, and the method further comprises:

storing first and second information indicating a result of the first operation in the first and second latch circuits, respectively.

9. The method according to claim 8, wherein storing first and second information includes: upon detection of a current flowing between the first and third wirings in the absence of a current between the second and third wirings in the first operation, storing, as the first information, a first value in the first latch circuit, and storing, as the second information, a second value different from the first value in the second latch circuit.

\* \* \* \* \*